United States Patent
Zivanovic et al.

(10) Patent No.: US 7,190,237 B2
(45) Date of Patent: Mar. 13, 2007

(54) OPEN-LOOP START-UP METHOD FOR A RESONATING DEVICE

(75) Inventors: Stevan Zivanovic, Wheeling, IL (US); Stephen J. Rober, Arlington Heights, IL (US)

(73) Assignee: Continental Automotive, Inc., Deer Park, IL (US)

( * ) Notice: Subject to any disclaimer, the term of this patent is extended or adjusted under 35 U.S.C. 154(b) by 257 days.

(21) Appl. No.: 10/855,204

(22) Filed: May 27, 2004

(65) Prior Publication Data

US 2005/0264366 A1  Dec. 1, 2005

(51) Int. Cl.
*H03L 7/00* (2006.01)
*H03B 5/30* (2006.01)

(52) U.S. Cl. ............ 331/155; 331/116 M; 331/154; 73/514.32

(58) Field of Classification Search ............ 331/16, 331/116 M, 154, 155; 73/514.32
See application file for complete search history.

(56) References Cited

U.S. PATENT DOCUMENTS

| 5,481,914 A | 1/1996 | Ward |
| 5,600,064 A | 2/1997 | Ward |
| 5,604,309 A | 2/1997 | Ward |
| 5,672,949 A | 9/1997 | Ward |
| 5,703,292 A | 12/1997 | Ward |
| 5,808,198 A | 9/1998 | Ward et al. |
| 2003/0171106 A1* | 9/2003 | Dunworth et al. ......... 455/262 |
| 2004/0242175 A1* | 12/2004 | Lin .......................... 455/147 |

FOREIGN PATENT DOCUMENTS

| WO | WO 02/10678 | 2/2002 |
| WO | WO 02/087083 A1 | 10/2002 |

* cited by examiner

*Primary Examiner*—Joseph Chang
(74) *Attorney, Agent, or Firm*—Thomas V. Miller; Gary J. Cunningham

(57) ABSTRACT

A system employing a resonating device and a controller implements a method involving an establishment by the controller of open-loop oscillations of the resonating device at a resonating frequency of the resonating device, and an establishment by the controller of closed-loop oscillations of the resonating device based on the open-loop oscillations of the resonating device at the resonating frequency. To this end, the controller controls an application and a tuning of a first open-loop drive signal to the resonating device based on a design-drive standard resonating frequency range whereby the controller can measure and designate a frequency of a resonating output signal from the resonating device as a calibration resonant frequency, and controls an application and a tuning of a second open-loop drive signal to the resonating device based on the calibration resonant frequency whereby the controller can subsequently apply a closed-loop drive signal to the resonating device.

11 Claims, 9 Drawing Sheets

OPEN-LOOP START-UP METHOD FOR A RESONATING DEVICE

FIELD OF THE INVENTION

The present invention generally relates to start-up methods for resonating devices. More specifically, the present invention relates to an open-loop method for a fast and reliable start-up of a gyroscopic sensor.

BACKGROUND OF THE INVENTION

FIG. 1 illustrates a closed-loop resonating system employing a resonating device 20 (e.g., a gyroscopic sensor) that needs to be operated at its resonant frequency by a closed-loop controller 30 to thereby provide a useful resonating output signal. To this end, start-up methods for resonating device 20 as known in the art rely on noise in closed loop controller 30 to generate a closed-loop drive signal CDS for establishing closed-loop oscillations of resonating device 20 at its resonating frequency to thereby facilitate a generation of a resonating output signal ROS by resonating device 20. Resonating output signal ROS is used as a feedback to closed-loop drive signal CDS via closed loop controller 30 to stabilize the closed-loop oscillation of resonating device 20 at its resonant frequency. A drawback of this closed-loop start-up method is a requirement of a wide spectrum and large amplitude of closed-loop drive signal CDS as well as a feedback circuit within closed loop controller 30 that is carefully tuned to resonating device 20. This poses restrictive limitations on manufacturing parameters of resonating devices and increases cost of mass producing tuning fork resonating devices, particularly in view of the fact that unavoidable variations in known processes for manufacturing resonating devices result in difference in the resonant frequencies in a significant number of the resonating devices.

SUMMARY OF THE INVENTION

The present invention advances the art by a contribution of a new and unique method for starting oscillations of a resonating device.

One form of the present invention is a method involving an establishment of open-loop oscillations of the resonating device at a resonating frequency of the resonating device and an establishment of closed-loop oscillations of the resonating device at the resonating frequency of the resonating device based on the open-loop oscillations of the resonating device at the resonating frequency of the resonating device.

A second form of the present invention is system employing a resonating device and a controller in electrical communication with the resonating device. The controller establishes open-loop oscillations of the resonating device at a resonating frequency of the resonating device and thereafter establishes closed-loop oscillations of the resonating device at the resonating frequency of the resonating device based on the open-loop oscillations of the resonating device at the resonating frequency of the resonating device.

A third form of the present invention is controller employing a processor and a drive module in electrical communication with the processor. When the drive module is in electrical communication with the resonating device, the processor operates the drive module to establish open-loop oscillations of the resonating device at a resonating frequency of the resonating device. The processor thereafter operates the drive module to establish closed-loop oscillations of the resonating device at the resonating frequency of the resonating device based on the open-loop oscillations of the resonating device at the resonating frequency of the resonating device.

A fourth form of the present invention is a method involving an application of an open-loop drive signal to the resonating device based on a standard resonating frequency range associated with a design of the resonating device, a tuning of the open-loop drive signal based on a standard resonating frequency range to facilitate a generation of a resonating output signal from the resonating device, and a measurement and designation of a frequency of the resonating output signal as a calibration resonant frequency of the resonating device.

A fifth form of the present invention is system employing a resonating device and a controller in electrical communication with the resonating device. The controller applies open-loop drive signal to the resonating device based on a standard resonating frequency range associated with a design of the resonating device, tunes the open-loop drive signal based on a standard resonating frequency range to facilitate a generation of a resonating output signal from the resonating device, and measures and designates a frequency of the resonating output signal as a calibration resonant frequency of the resonating device.

A sixth form of the present invention is controller employing a processor and drive module in electrical communication with the processor. When the drive module is in electrical communication with the resonating device, the processor operates the drive module to apply an open-loop drive signal to the resonating device based on a standard resonating frequency range associated with a design of the resonating device, and to tune the open-loop drive signal based on a standard resonating frequency range to facilitate a generation of a resonating output signal from the resonating device. The processor measures and designates a frequency of the resonating output signal as a calibration resonant frequency of the resonating device.

A seventh form of the present invention is a method involving an application of an open-loop drive signal to the resonating device based on the calibration resonant frequency, a tuning of the open-loop drive signal based on a calibration frequency range defined by the calibration resonant frequency to facilitate a generation of a resonating output signal by the resonating device, and an application of a closed-loop drive signal to the resonating device subsequent to the generation of the resonating output signal by the resonating device at the resonant frequency.

An eighth form of the present invention is system employing a resonating device and a controller in electrical communication with the resonating device. The controller an applies an open-loop drive signal to the resonating device based on the calibration resonant frequency, tunes the open-loop drive signal based on a calibration frequency range defined by the calibration resonant frequency to facilitate a generation of a resonating output signal by the resonating device, and applies a closed-loop drive signal to the resonating device subsequent to the generation of the resonating output signal by the resonating device at the resonant frequency.

A ninth form of the present invention is controller employing a processor and drive module in electrical communication with the processor. When the drive module is in electrical communication with the resonating device, the processor operates the drive module to apply an open-loop drive signal to the resonating device based on the calibration resonant frequency and to tune the open-loop drive signal based on a calibration frequency range defined by the calibration resonant frequency to facilitate a generation of a resonating output signal by the resonating device. The processor thereafter operates the drive module to apply a closed-loop drive signal to the resonating device subsequent to the generation of the resonating output signal by the resonating device at the resonant frequency.

The terms "electrical communication" and "electrically communicates" are defined herein as an electrical connection, an electrical coupling or any other technique for electrically applying a signal from an output of one device to an input of a second device.

The foregoing forms as well as other forms, features and advantages of the invention will become further apparent from the following detailed description of the presently preferred embodiments, read in conjunction with the accompanying drawings. The detailed description and drawings are merely illustrative of the invention rather than limiting, the scope of the invention being defined by the appended claims and equivalents thereof.

DETAILED DESCRIPTION OF THE PRESENTLY PREFERRED EMBODIMENTS

Figure 1:
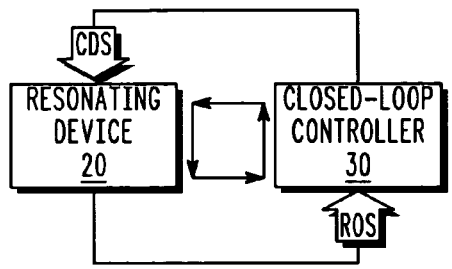
FIG. 1 illustrates a closed-loop resonating system as known in the art.
Figure 3:
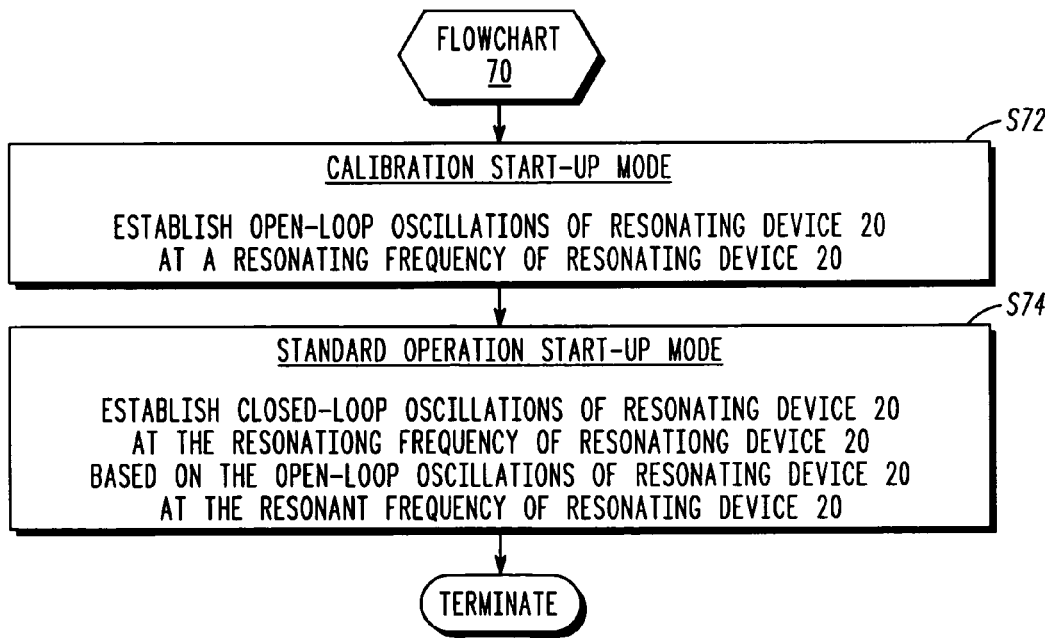
FIG. 3 illustrates a flowchart representative of a first embodiment of a resonating start-up method in accordance with the present invention for the resonating device illustrated in FIGS. 1 and 2.

FIG. 3 illustrates a flowchart 70 representative of a method for starting-up resonating device 20 (FIG. 1). A calibration start-up mode of a stage S72 of flowchart 70 and a standard operation start-up mode of a stage S74 of flowchart 70 are sequentially implemented during an initial execution of flowchart 70 for resonating device 20. Thereafter, calibration start-up mode of stage S72 of flowchart 70 may be omitted during subsequent executions of flowchart 70, particularly when the calibration start-up mode of stage S72 is performed in a factory setting prior to a commercial use or sale of the present invention.

Figure 2:
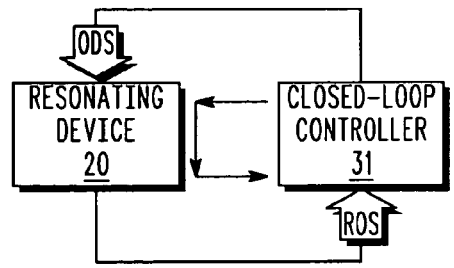
FIG. 2 illustrates an open-loop resonating system in accordance with the present invention.
Figure 4:
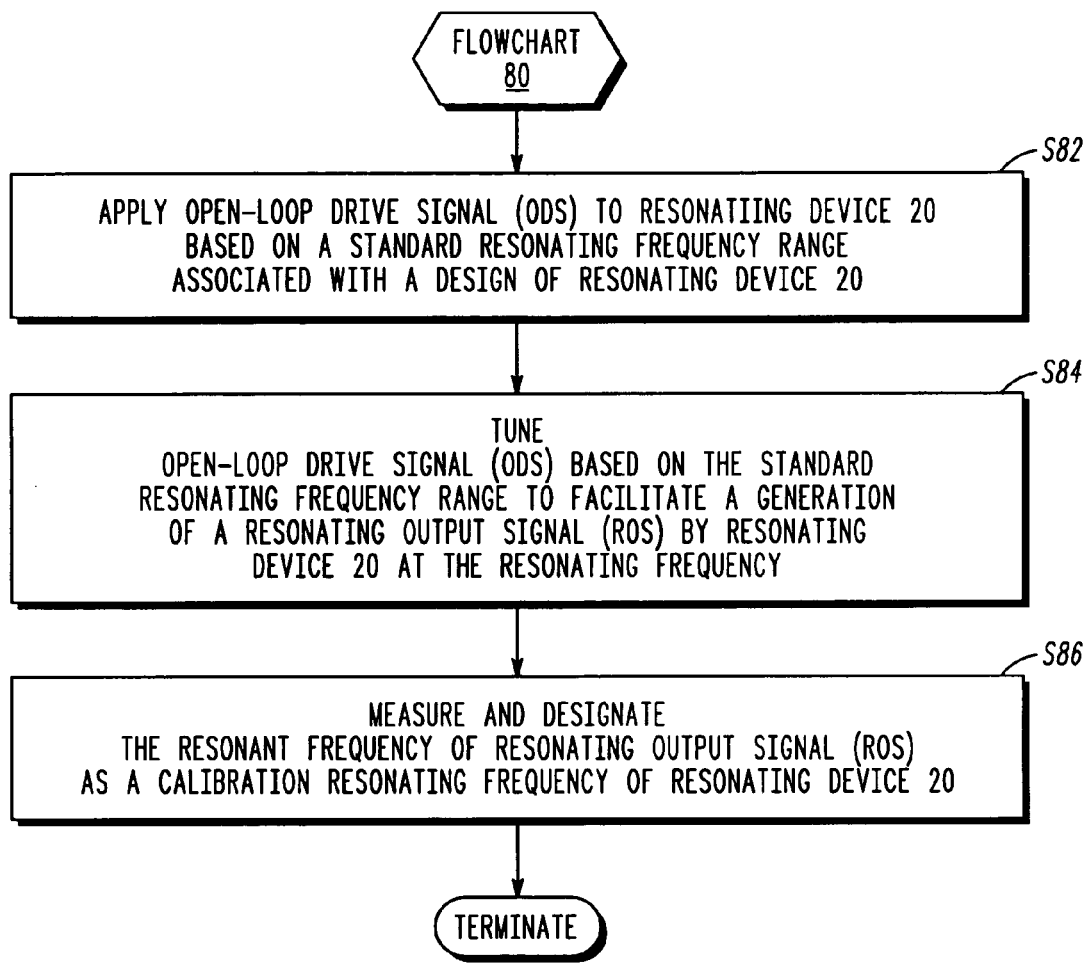
FIG. 4 illustrates a flowchart representative of one embodiment of a calibration start-up stage in accordance with the present invention for the resonating start-up method illustrated in FIG. 3.

The calibration start-up mode of stage S72 involves an establishment, as illustrated in FIG. 2, by an open-loop controller 31 of open-loop oscillations of resonating device 20 at its resonating frequency. In practice, the acts for implementing stage S72 are dependent upon the design of resonating device 20 and the design of open-loop controller 31, and are therefore without limit. In one embodiment of stage S72, a flowchart 80 as illustrated in FIG. 4 is executed.

A stage S82 of flowchart 80 involves an application, as illustrated in FIG. 2, by open-loop controller 31 of an open-loop drive signal ODS to resonating device 20 based on a standard resonating frequency range associated with the design of resonating device 20. A stage S84 of flowchart 80 involves a tuning (e.g., a sweep or a ping) by open-loop controller 31 of the open-loop drive signal ODS within the standard resonating frequency range to facilitate a generation, as illustrated in FIG. 2, of a resonating output signal ROS by resonating device 20 at its resonant frequency. A stage S86 of flowchart 80 involves a measurement and designation by open-loop controller 31 of the frequency of resonating output signal ROS as a calibration resonant frequency of resonating device 20. In practice, the acts for implementing stages S82–S86 are also dependent upon the design of resonating device 20 and open-loop controller 31, and are therefore without limit.

Figure 5:
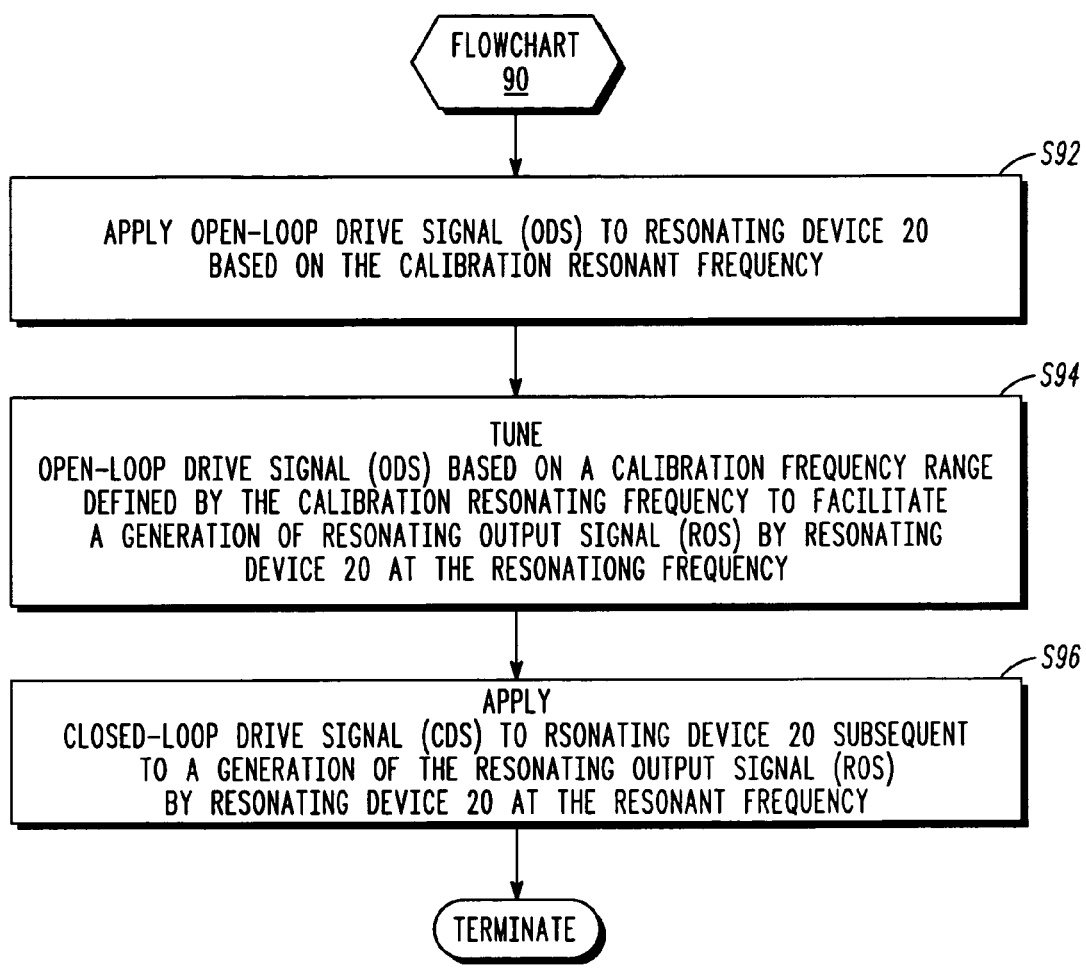
FIG. 5 illustrates a flowchart representative of one embodiment of a standard operation start-up stage in accordance with the present invention for the resonating start-up method illustrated in FIG. 3.

The standard operation start-up mode of stage S74 involves an establishment by controllers 30 and 31 of closed-loop oscillations of resonating device 20 at its resonating frequency based on the open-loop oscillations of resonating device 20 at its resonating frequency. In practice, the acts for implementing stage S74 are also dependent upon the design of resonating device 20 and controllers 30 and 31, and are therefore without limit. In one embodiment of stage S74, a flowchart 90 as illustrated in FIG. 5 is executed.

A stage S92 of flowchart 90 involves an application, as illustrated in FIG. 2, by open-loop controller 31 of open-loop drive signal ODS to resonating device 20 based on the calibration resonant frequency. A stage S94 of flowchart 90 involves a tuning (e.g., a sweep or a ping) by open-loop controller 31 of the open-loop drive signal ODS within a calibration frequency range defined by the calibration resonant frequency to facilitate a generation, as illustrated in FIG. 2, of resonating output signal ROS by resonating device 20 at its resonant frequency. A stage S96 of flowchart 90 involves an application, as illustrated in FIG. 3, of closed-loop drive signal CDS by closed-loop controller 30 to resonating device 20 subsequent to the generation of resonating output signal ROS by resonating device 20 at its resonant frequency. In practice, the acts for implementing stages S92–S96 are also dependent upon the design of resonating device 20 and controllers 30 and 31, and are therefore without limit.

Figure 6:
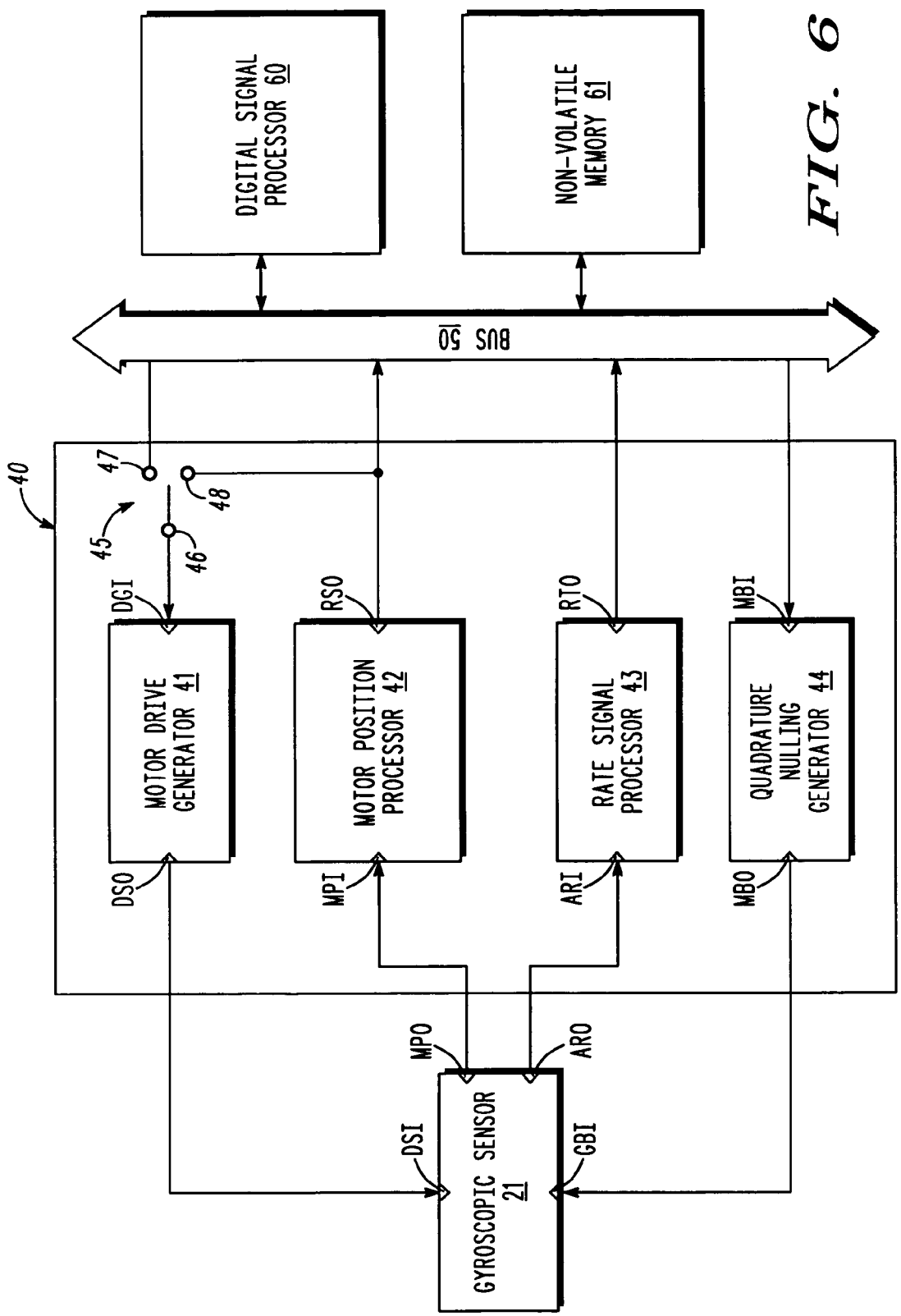
FIG. 6 illustrates one embodiment of a gyro system in accordance with the present invention.

FIG. 6 illustrates a controller 33 as an exemplary structural configuration for implementing flowchart 70 (FIG. 3) to start-up a resonating device in the form of a gyroscopic sensor 21 (e.g., a tuning fork gyroscopic sensor). Controller 33 employs a drive module 40, a bus 50, a digital signal processor 60 and a non-volatile memory 61. Drive module 40 employs a motor driver generator 41, a motor position processor 42, a rate signal processor 43, and a quadrature nulling generator 44. Drive module 40 further employs a single pole/double throw ("SPDT") switch 45 for transitioning controller 33 between an open-loop state and a closed-loop state as will be subsequently described herein.

A drive signal output DSO of motor drive generator 41 is electrically connected a drive signal input DSI of gyroscopic sensor 21. A motor position output MPO of gyroscopic sensor 21 is electrically connected to a motor position input MPI of motor position processor 42. A response signal output RSO of motor position processor 42 is electrically coupled to digital signal processor 60 via electrical connections to bus 50 and can be electrically connected to motor drive generator 41 via switch 45.

An angular rate output ARO of gyroscopic sensor 21 is electrically connected to an angular rate input ARI of rate signal processor 43. A rate signal output RTO of rate signal processor 43 is electrically coupled to digital signal processor 60 via electrical connections to bus 50. A motor bias input MBI of quadrature nulling generator 44 is electrically coupled to digital signal processor 60 via electrical connections to bus 50.

A motor bias output MBO of quadrature nulling generator 44 is illustrated as being electrically connected to a gyro bias input GBI of gyroscopic sensor 21 for simplicity in describing FIG. 6. However, in practice, those having ordinary skill in the art will appreciate that motor bias output MBO of quadrature nulling generator 44 will either be electrically connected to drive signal output DSO of motor drive generator 41 in a manner that is either internal or external to drive module 40, or electrically connected to a drive bias input (not shown) of motor drive generator 41 whereby gyroscopic sensor 21 receives a drive signal consisting of an ac component from motor drive generator 41 and a dc component from quadrature nulling generator 44.

A base connector 46 of SPDT switch 45 is electrically connected to a drive generator input DGI of motor drive generator 41. An open-loop connector 47 of SPDT switch 45 is electrically coupled to digital signal processor 60 via electrical connections to bus 50. A closed-loop connector 48 of SPDT switch 45 is electrically connected to response signal output RSO of motor position processor 42. A control input of SPDT switch 45 (not shown) is in electrical communication with digital signal processor 60 via electrical connections to bus 50.

Digital signal processor 60 and non-volatile memory 61 are electrically coupled via electrical connections to bus 50.

Figure 7:
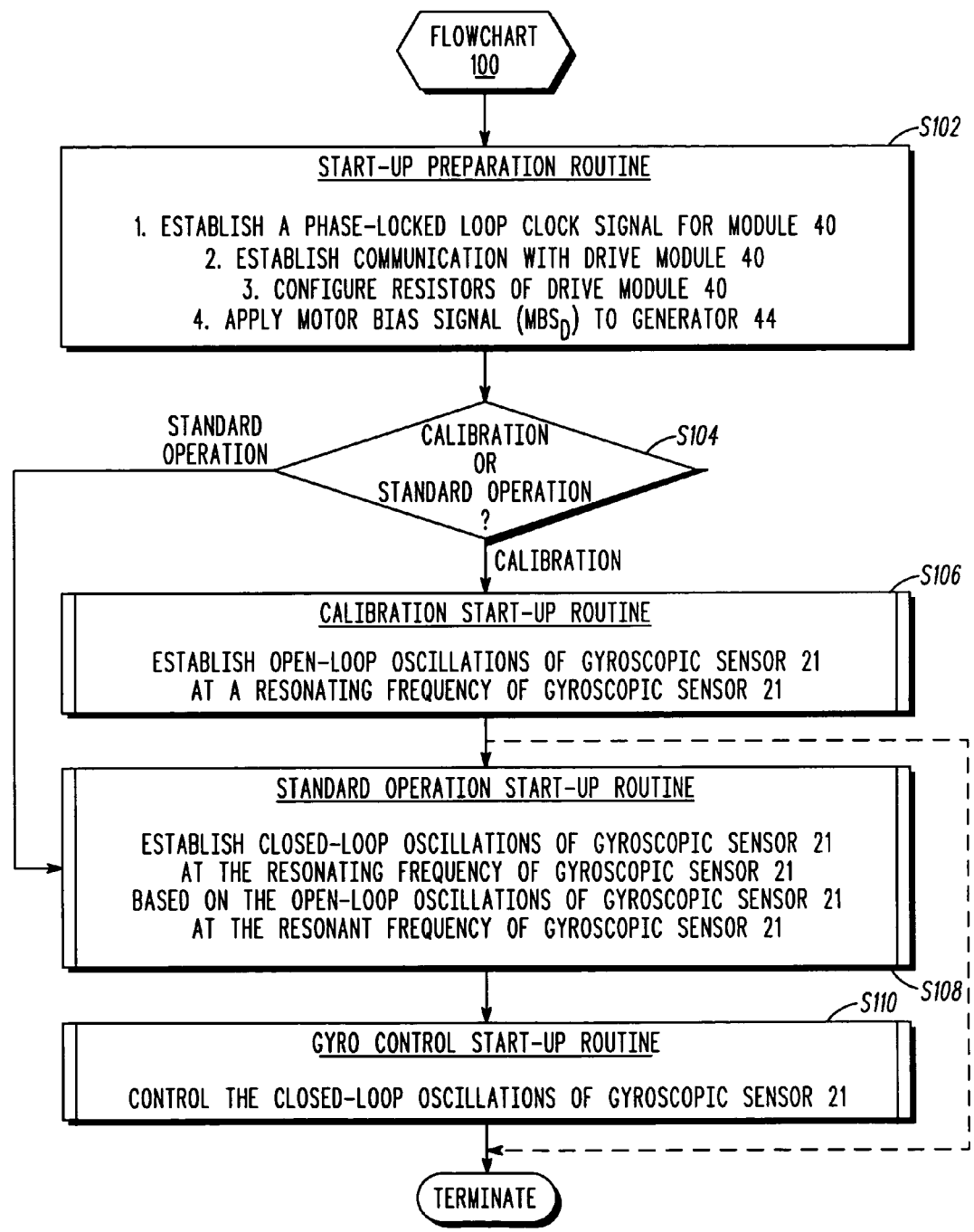
FIG. 7 illustrates a flowchart representative of one embodiment of a gyro start-up method in accordance with the present invention for a gyroscopic sensor illustrated in FIG. 6.

Controller 33 operates as open-loop controller 31 (FIG. 2) whenever digital signal processor 60 via the control input of SPDT switch 45 controls a connection of base connector 46 to open-loop connector 47. Conversely, controller 33 operates as closed-loop controller 30 (FIG. 1) whenever digital signal processor 60 via the control input of SPDT switch 45 controls a connection of base connector 46 to closed-loop connector 48 FIG. 7 illustrates a flowchart 100 representative of a resonating start-up method of the present invention that is executed by digital signal processor 60. A start-up preparation routine involving several preparation acts are implemented during a stage S102 of flowchart 100. First, digital signal processor 60 establishes a phase-locked loop clock signal for drive module 40. Second, digital signal processor 60 establishes communications with the components of drive module 40.

Third, digital signal processor 60 configures various registers (not shown) of drive module 40. Those having ordinary skill in the art will appreciate registers that can be used in a commercial implementation of the present invention, such as, for example a initial motor drive amplitude register for setting a maximum amplitude of open-loop drive signal ODS (FIG. 2) generated by motor drive generator 41, and a motor position gain register for controlling an amplitude gain of a motor position signal MPS (FIG. 10) generated by gyroscopic sensor 21.

Finally, digital signal processor 60 applies a motor bias signal $MBS_D$ in digital form to quadrature nulling converter 44, which in turn converts motor bias signal $MBS_D$ into analog form and applies a motor bias signal $MBS_A$ to gyroscopic sensor 21.

During a stage S104 of flowchart 100, digital signal processor 60 determines whether to proceed to a calibration start-up routine of a stage S106 of flowchart 100 or a standard operation start-up routine of a stage S108 of flowchart 100. In practice, the factors involved in the stage S104 determination by digital signal processor 60 are dependent upon a commercial implementation of the present invention, and are therefore without limit. In one embodiment, digital signal processor 60 only proceeds from stage S104 to stage S106 during the initial execution of flowchart 100 by digital signal processor 60, and thereafter proceeds from stage S104 to stage S108 during subsequent executions of flowchart 100 by digital signal processor 60.

Figure 8:
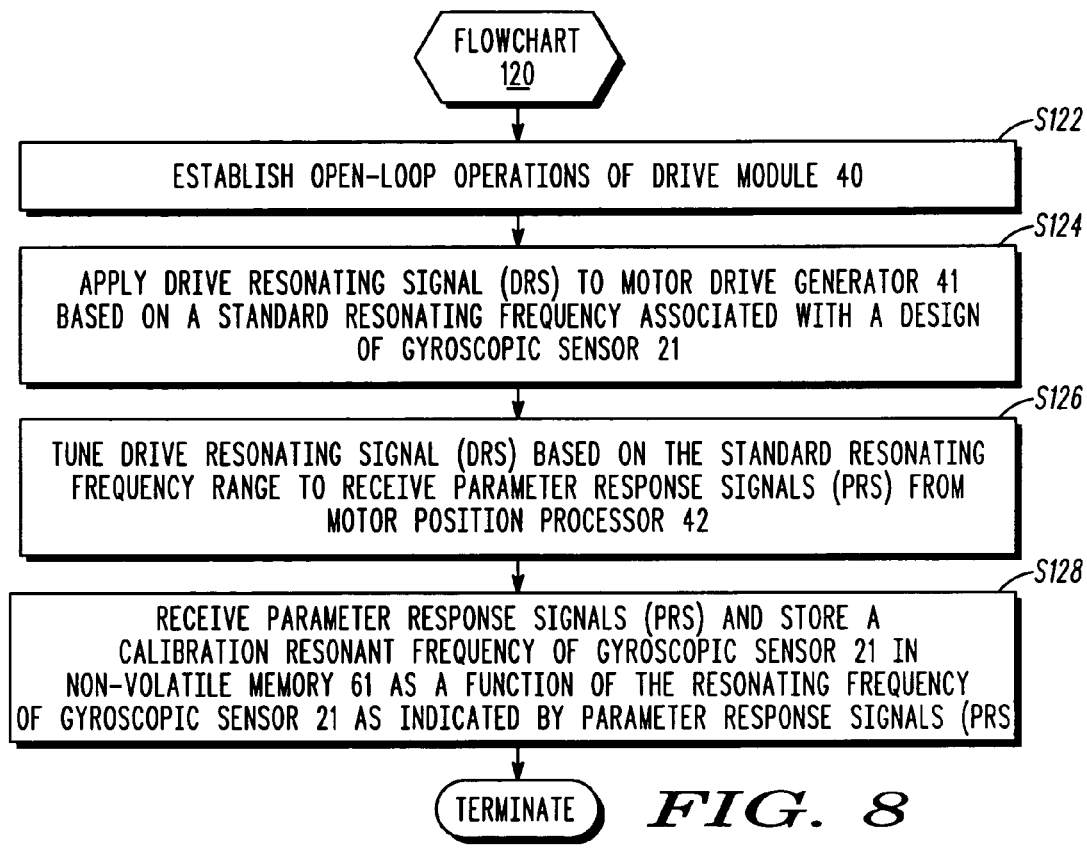
FIG. 8 illustrates a flowchart representative of one embodiment of a calibration start-up routine in accordance with the present invention for the gyro start-up method illustrated in FIG. 7.

The calibration start-up routine of stage S106 involves an establishment by an digital signal processor 60 of open-loop oscillations of gyroscopic sensor 21 at its resonating frequency. In practice, the acts for implementing stage S106 are dependent upon the design of gyroscopic sensor 21, motor drive generator 41, motor position processor 42 and digital signal processor 60, and are therefore without limit. In one embodiment of stage S106, a flowchart 120 as illustrated in FIG. 8 is executed by digital signal processor 60.

Figure 10:
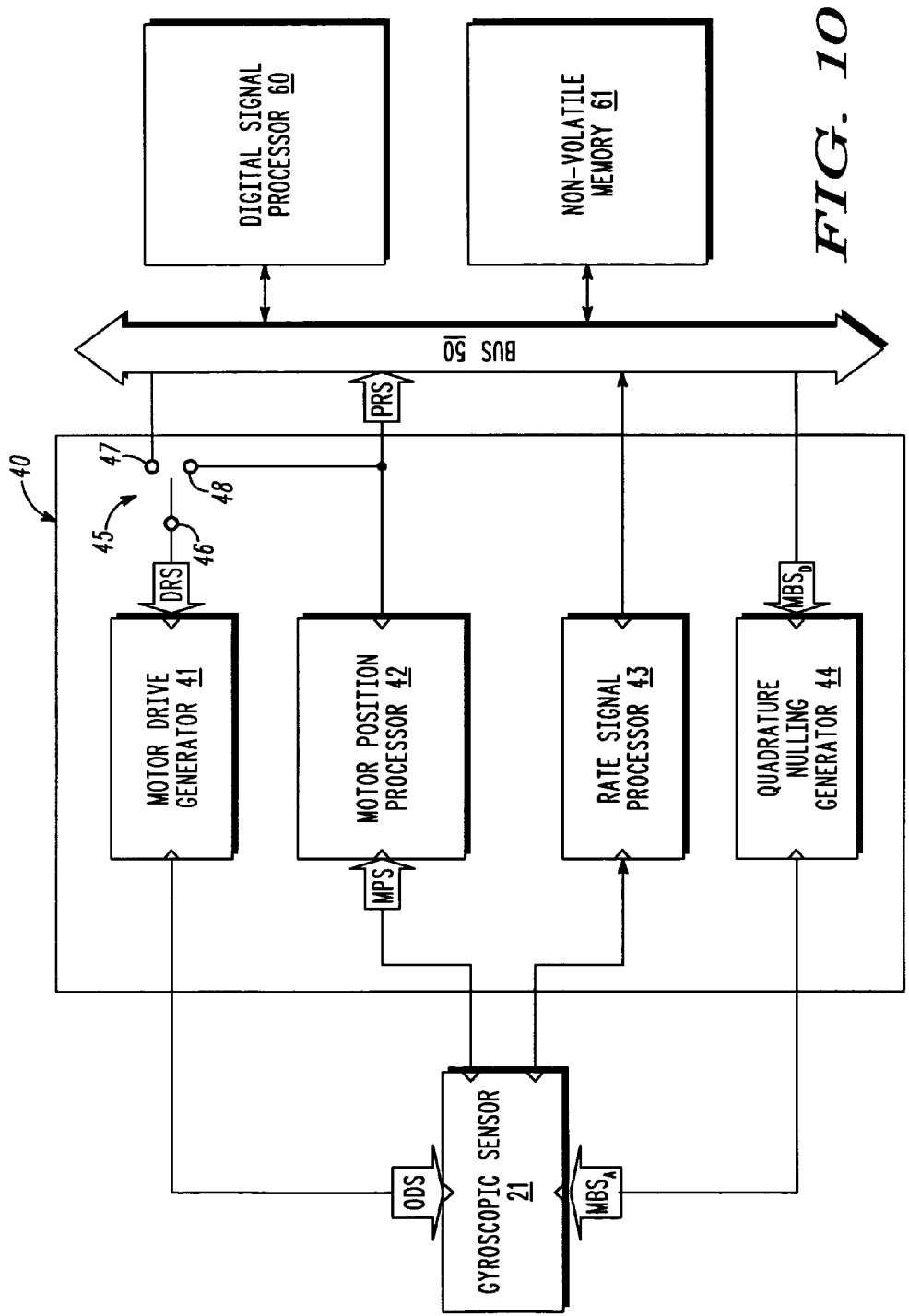
FIG. 10 illustrates an exemplary open-loop operation of the gyro system illustrated in FIG. 6.

A stage S122 of flowchart 120 involves an establishment by digital signal processor 60 of open-loop operations of drive module 40 by controlling an electrical connection of connector 46 to connector 47 as illustrated in FIG. 10. A stage S124 of flowchart 120 involves an application, as illustrated in FIG. 10, by digital signal processor 60 of a drive resonating signal DRS to motor driver generator 41 at a standard resonating frequency range associated with a design of gyroscopic sensor 21, which results in an application by motor drive generator 41 of open-loop drive signal ODS to gyroscopic sensor 21 based on a standard resonating frequency range associate with the design of gyroscopic sensor 21. A stage S126 of flowchart 120 involves a tuning (e.g., a sweep or ping) by digital signal processor 60 of drive resonating signal DRS, which results in a tuning by motor drive generator 41 of open-loop drive signal ODS within a standard drive frequency range associated with the design of gyroscopic sensor 21 to facilitate a generation, as illustrated in FIG. 10, of a resonating output signal by gyroscopic sensor 21 in the form of a motor position signal MPS at its resonant frequency.

Figure 9:
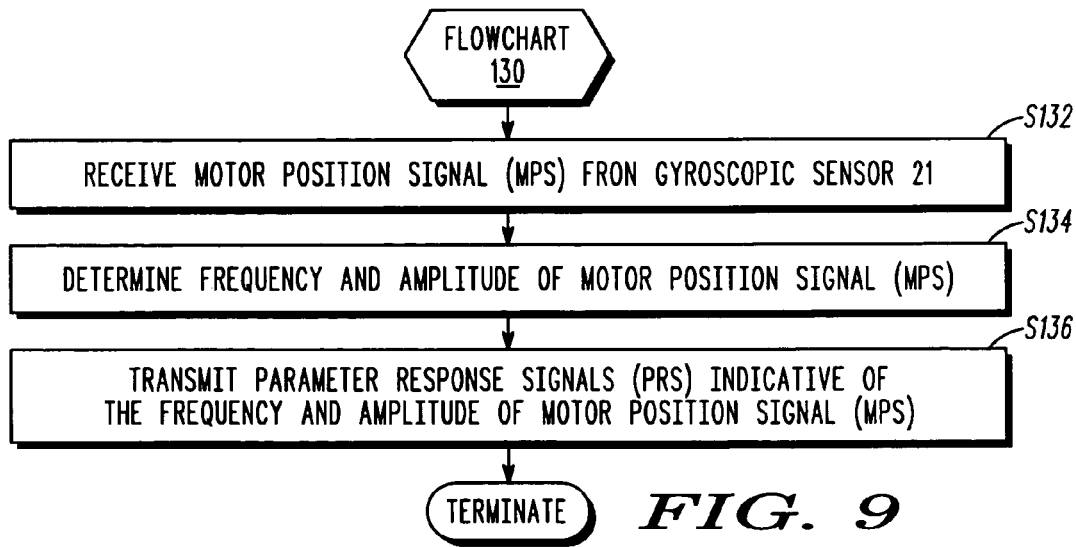
FIG. 9 illustrates a flowchart representative of one embodiment of a motor position determination routine in accordance with the present invention for the calibration start-up routine illustrated in FIG. 8.

Motor position signal MPS is received by motor position processor 42, which implements a flowchart 130 as illustrated in FIG. 9 upon receiving motor position signal MPS during a stage S132 of flowchart 130. A stage S134 of flowchart 130 involves a determination by motor position processor 42 of a frequency and amplitude of motor position signal MPS. A stage S136 of flowchart 130 involves a transmission of parameter response signals PRS from motor position processor 42 to digital signal processor 60 where parameter response signals PRS are indicative of the frequency and amplitude of motor position signal MPS.

In practice, the content and form of parameter response signals PRS are dependent upon a design of motor position processor 42. In one embodiment of stage S136, parameter response signals PRS include a digital signal indicative of the frequency of motor position signal MPS and an analog signal indicative of the amplitude of motor position signal MPS. In another embodiment of stage S136, parameter response signals PRS include a pair of digital signals indicative of the frequency and amplitude, respectively, of the motor position signal MPS.

Upon receiving parameter response signals PRS during a stage S128 of flowchart 120, digital signal processor 60 stores a calibration resonant frequency of gyroscopic sensor 21 in non-volatile memory 61 as a function of the resonating frequency of gyroscopic sensor 21 as indicated by parameter response signals PRS. In practice, the acts for implementing stage S128 are also dependent upon the design of gyroscopic sensor 21, and is therefore without limit. In one embodiment, the frequency of motor position signal MPS is deemed by digital signal processor 60 to be the resonating frequency of gyroscopic sensor 21 if the frequency of motor position signal MPS substantially equals the frequency of drive resonating signal DRS and the amplitude of motor position signal MPS is within an amplitude range associated with the design of gyroscopic sensor 21.

Figure 11:
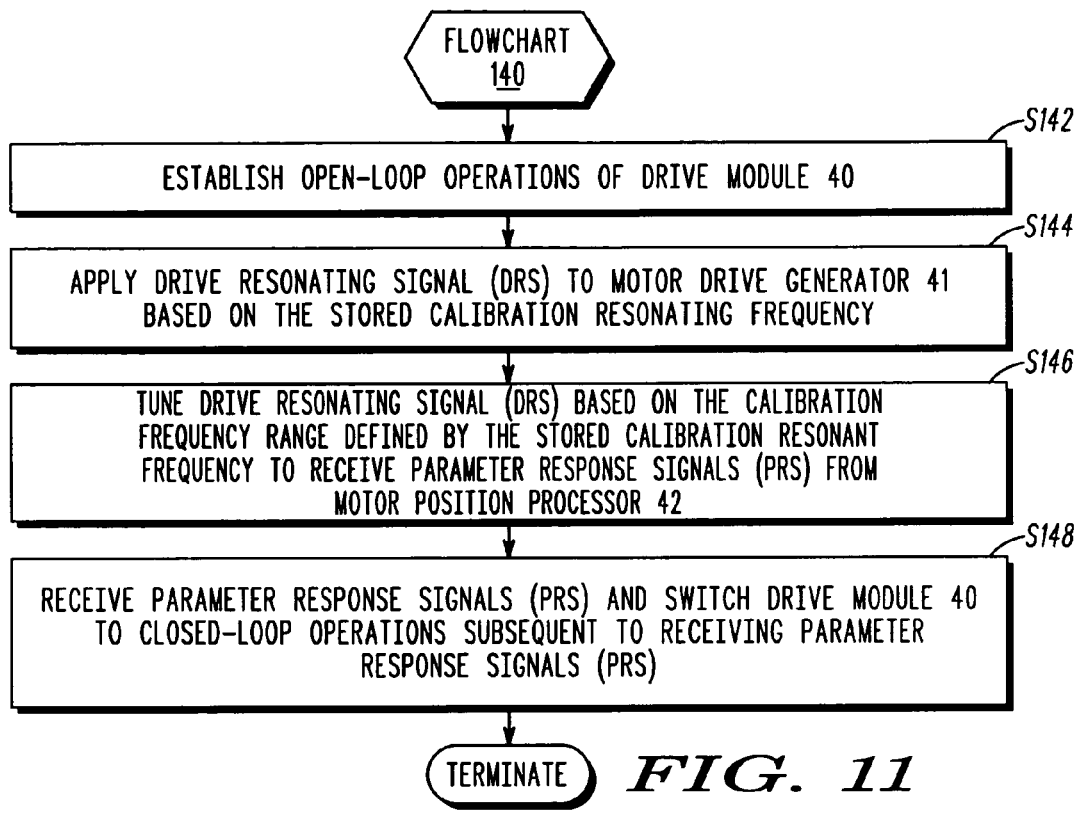
FIG. 11 illustrates a flowchart representative of one embodiment of a standard operation start-up routine in accordance with the present invention for the gyro start-up method illustrated in FIG. 7.

Referring again to FIG. 7, the standard operation start-up routine of stage S108 involves an establishment by the controller of closed-loop oscillations of gyroscopic sensor 21 at its resonating frequency based on the open-loop oscillations of gyroscopic sensor 21 at its resonating frequency. In practice, the acts for implementing stage S108 are also dependent upon the design of gyroscopic sensor 21 and the controller, and are therefore without limit. In one embodiment of stage S108, a flowchart 140 as illustrated in FIG. 11 is executed by digital signal processor 60.

A stage S142 of flowchart 140 involves an establishment by digital signal processor 60 of open-loop operations of drive module 40 by controlling an electrical connection of connector 46 to connector 47 as illustrated in FIG. 10. A stage S144 of flowchart 140 involves an application, as illustrated in FIG. 10, by digital signal processor 60 of drive resonating signal DRS to motor driver generator 41 as a function of the stored calibration resonant frequency, which results in an application by motor drive generator 41 of open-loop drive signal ODS to gyroscopic sensor 21. In practice, the acts for implementing stage S144 is dependent upon a design of gyroscopic sensor 21 and motor drive generator 41, and are therefore without limit. In one embodiment, digital signal processor applies drive resonating signal DRS to motor driver generator 41 at a frequency that is slightly lower than the stored calibration resonant frequency to facilitate stage S146 of flowchart 140, which involves a tuning (e.g., a sweep or ping) by digital signal processor 60 of drive resonating signal DRS based on a calibration frequency range defined by the stored calibration resonant frequency. The result is a tuning by motor drive generator 41 of open-loop drive signal ODS to facilitate a generation, as illustrated in FIG. 10, of motor position signal MPS at its resonant frequency. Motor position signal MPS is received by motor position processor 42, which implements a flowchart 130 (FIG. 9) as previously described herein.

Figure 13:
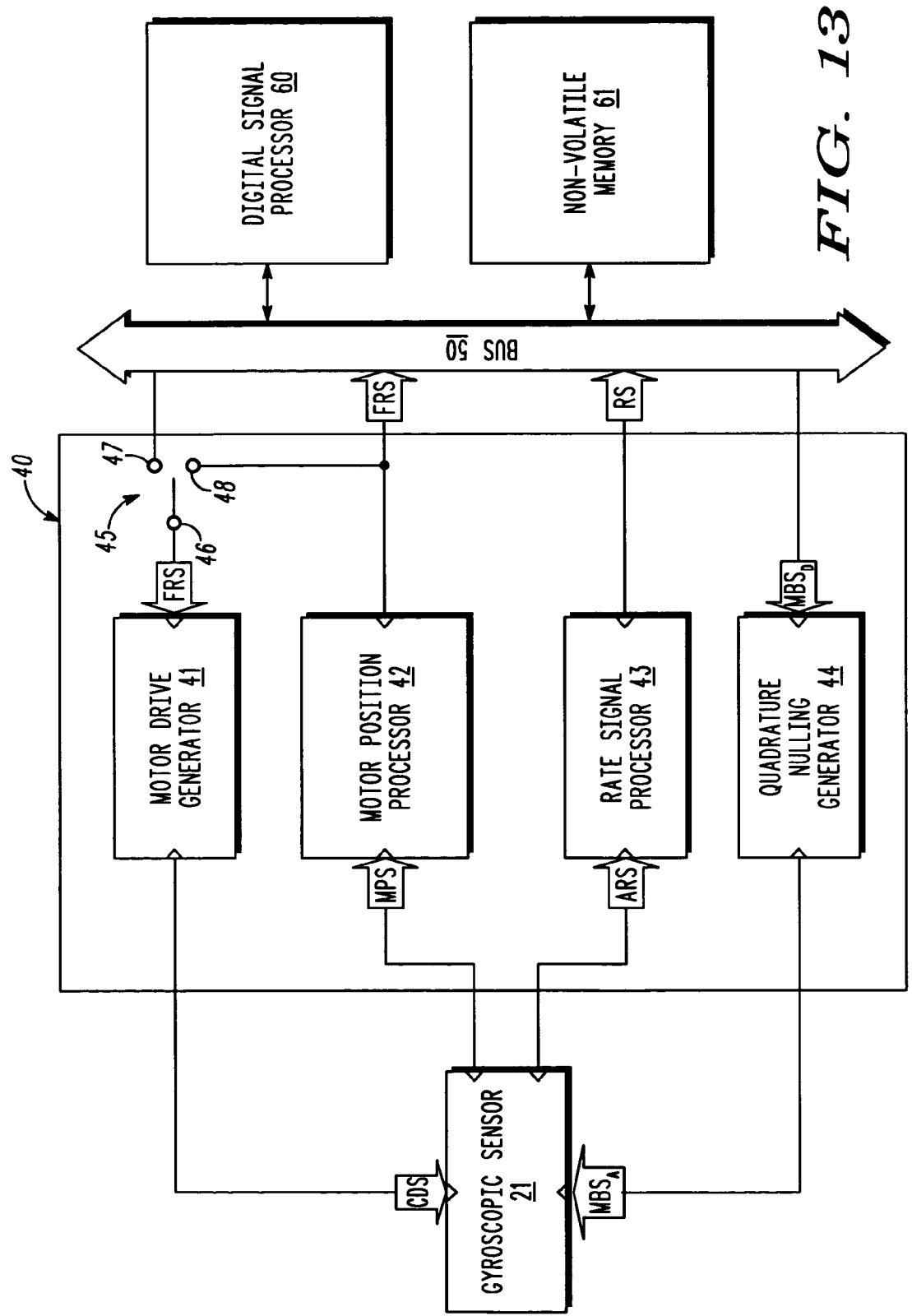
FIG. 13 illustrates an exemplary closed-loop operation of the gyro system illustrated in FIG. 6.

Upon receiving parameter response signals PRS during a stage S148 of flowchart 140, digital signal processor 60 switches, immediately or with delay, drive module 40 to closed-loop operations by connecting connector 46 to connector 48. The result, as illustrated in FIG. 13, is an application by motor drive generator 41 of closed-loop drive signal CDS to gyroscopic sensor 21 where the motor drive generator 41 utilizes conventional feedback response signals FRS from motor position processor 42 in generating closed-loop drive signal CDS.

Figure 12:
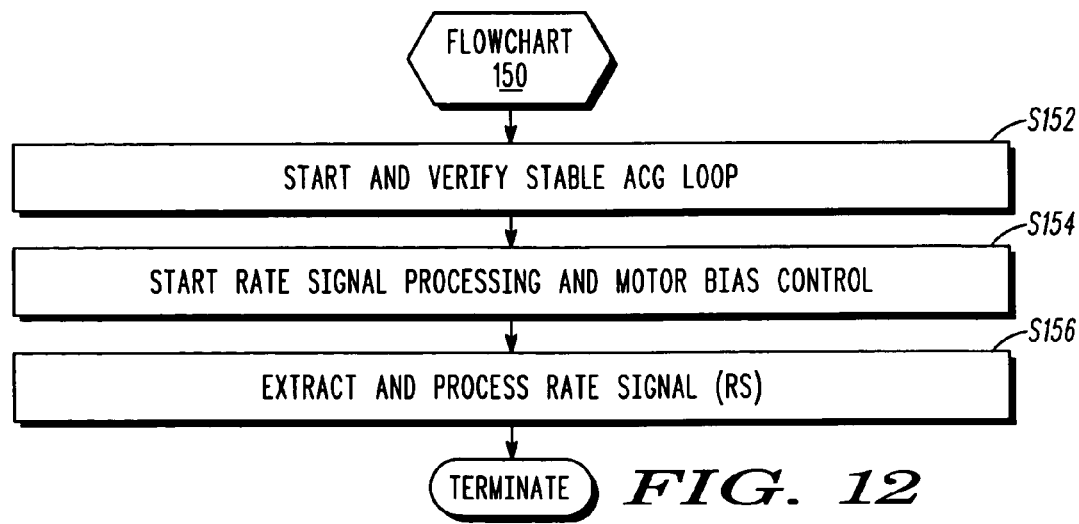
FIG. 12 illustrates a flowchart representative of one embodiment of a gyro control routine in accordance with of the present invention for the gyro start-up method illustrated in FIG. 7.

Referring again to FIG. 7, a gyro control start-up routine of stage S10 of flowchart 100 involves a control of the closed-loop oscillations of gyroscopic sensor 21. In practice, the acts implemented during stage S110 are dependent upon the design of gyroscopic sensor 21 and drive module 40, and are therefore without limit. In one embodiment, a flowchart 150 as illustrated in FIG. 12 is implemented by controller 33.

A stage S152 of flowchart 150 involves a conventional start and verification of a stable AGC loop of motor position signal MPS via feedback response signal FRS. A stage S154 of flowchart 150 involves a start of a conventional rate signal processing via an angular rate signal ARS from gyroscopic sensor 21 and a start of a conventional motor biasing control of a motor biasing signal MBSA. A stage S156 of flowchart 150 involves an extraction of a rate signal RS from rate signal processor 43 whereby digital signal processor 60 conventionally processes rate signal RS to determine a completion of the start-up of gyroscopic sensor 21.

The present invention may be embodied in other specific forms without departing from its spirit or essential characteristics. For example, the mathematical principles of linearity and superposition may enable the re-ordering of certain steps of the described embodiments, or may enable additional specific embodiments having essentially the same function, and such variations are within the scope of the present invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A method, comprising:
   establishing open-loop oscillations of a resonating device at a resonating frequency of the resonating device, wherein the resonating frequency of the resonating device is predetermined prior to the establishing the open-loop oscillations of the resonating device based on a design of the resonating device; and
   establishing closed-loop oscillations of the resonating device at the predetermined resonating frequency of the resonating device based on the open-loop oscillations of the resonating device at the resonating frequency of the resonating device.

2. The method of claim 1, wherein establishing open-loop oscillations of the resonating device at a resonating frequency of the resonating device includes:
   applying a first open-loop drive signal to the resonating device based on a standard resonating frequency range associated with a design of the resonating device;
   tuning the first open-loop drive signal based on a standard resonating frequency range to facilitate a first generation of a resonating output signal from the resonating device; and measuring and designating a frequency of the resonating output signal as a calibration resonant frequency of the resonating device.

3. The method of claim 1, wherein establishing closed-loop oscillations of the resonating device based on the open-loop oscillations of the resonating device at the resonating frequency of the resonating device includes:

applying a second open-loop drive signal to the resonating device based on the calibration resonant frequency;

tuning the second open-loop drive signal based on a calibration frequency range defined by the calibration resonant frequency to facilitate a second generation of the resonating output signal by the resonating device; and applying a closed-loop drive signal to the resonating device subsequent to receiving the resonating output signal from the resonating device.

4. A method, comprising:

applying a first open-loop drive signal to a resonating device based on a standard resonating frequency range associated with a design of the resonating device;

tuning the first open-loop drive signal based on a standard resonating frequency range to facilitate a first generation of a resonating output signal from the resonating device; and measuring and designating a frequency of the resonating output signal as a calibration resonant frequency of the resonating device.

5. The method of claim 4, further comprising:

applying a second open-loop drive signal to the resonating device based on the calibration resonant frequency subsequent to measuring and designating a frequency of the resonating output signal as a calibration resonant frequency of the resonating device;

tuning the second open-loop drive signal based on a calibration frequency range defined by the calibration resonant frequency to facilitate a second generation of the resonating output signal by the resonating device; and applying a closed-loop drive signal to the resonating device subsequent to the second generation of the resonating output signal by the resonating device at the resonant frequency.

6. A system, comprising:

a resonant device; and a controller in electrical communication with the resonant device, wherein the controller is operable to establish open-loop oscillations of a resonating device at a resonating frequency of the resonating device, and to establish closed-loop oscillations of the resonating device at the resonating frequency of the resonating device based on the open-loop oscillations of the resonating device at the resonating frequency of the resonating device, and wherein the resonating frequency of the resonating device is predetermined prior to the establishing the open-loop oscillations of the resonating device based on a design of the resonating device.

7. The system of claim 6, wherein establishing open-loop oscillations of the resonating device at a resonating frequency of the resonating device includes:

an application of a first open-loop drive signal to the resonating device by the controller based on a standard resonating frequency range associated with a design of the resonating device;

a tuning of the first open-loop drive signal by the controller within a standard resonating frequency range to facilitate a first generation of a resonating output signal from the resonating device; and a measurement and designation by the controller of a frequency of the resonating output signal as a calibration resonant frequency of the resonating device.

8. The system of claim 6, wherein establishing closed-loop oscillations of the resonating device based on the open-loop oscillations of the resonating device at a resonating frequency of the resonating device includes:

an application of a second open-loop drive signal to the resonating device by the controller based on the calibration resonant frequency;

a tuning of the second open-loop drive signal by the controller within a calibration frequency range defined by the calibration resonant frequency to facilitate a second generation of the resonating output signal by the resonating device; and an application of a closed-loop drive signal to the resonating device by the controller subsequent to the second generation of the resonating output signal by the resonating device at the resonant frequency.

9. A controller, comprising:

a motor drive generator operable to be in electrical communication with a resonating device; and a processor in electrical communication with the motor drive generator, wherein, when the motor drive generator is in electrical communication with the resonating device, the processor is operable to control an establishment of open-loop oscillations of a resonating device at a resonating frequency of the resonating device, and to control an establishment of closed-loop oscillations of the resonating device at the resonating frequency of the resonating device based on the open-loop oscillations of the resonating device at the resonating frequency of the resonating device, and wherein the resonating frequency of the resonating device is predetermined prior to the establishing the open-loop oscillations of the resonating device based on a design of the resonating device.

10. The controller of claim 9, wherein the control of an establishment of open-loop oscillations of the resonating device at a resonating frequency of the resonating device includes:

the processor controlling an application of a first open-loop drive signal to the resonating device by the motor drive generator based on a standard resonating frequency range associated with a design of the resonating device;

the processor controlling a tuning of the first open-loop drive signal by the motor driver generator within a standard resonating frequency range to facilitate a first generation of a resonating output signal from the resonating device; and the processor controlling a measurement and a designation of a frequency of the resonating output signal as a calibration resonant frequency of the resonating device.

11. The controller of claim 9, wherein the control of an establishment of closed-loop oscillations of the resonating device based on the open-loop oscillations of the resonating device at a resonating frequency of the resonating device includes:
  the processor controlling an application of a second open-loop drive signal to the resonating device by the motor driver generator based on the calibration resonant frequency;
  the processor controlling a tuning of the second open-loop drive signal by motor driver generator within a calibration frequency range defined by the calibration resonant frequency to facilitate a second generation of the resonating output signal by the resonating device; and the processor controlling an application of a closed-loop drive signal to the resonating device by the motor driver generator subsequent to the generation of the resonating output signal by the resonating device at the resonant frequency.

* * * * *